(12) United States Patent
Opitz et al.

(10) Patent No.: US 6,557,250 B2
(45) Date of Patent: May 6, 2003

(54) MULTILAYER BOARD COMPOUND AND METHOD FOR THE MANUFACTURE THEREOF

(75) Inventors: Rudi W Opitz, Oberasbach (DE); Walter P Stuckmann, Zirndorf (DE)

(73) Assignee: rotra Leiterplatten Produktions- und Vertriebs GmbH, Nürnberg (DE)

( * ) Notice: Subject to any disclaimer, the term of this patent is extended or adjusted under 35 U.S.C. 154(b) by 0 days.

(21) Appl. No.: 10/003,296

(22) Filed: Dec. 6, 2001

(65) Prior Publication Data

US 2002/0170745 A1 Nov. 21, 2002

(30) Foreign Application Priority Data

May 18, 2001 (DE) .......................................... 101 26 002

(51) Int. Cl.[7] .................................................. H05K 3/36
(52) U.S. Cl. .............................. 29/830; 29/825; 29/830; 29/852
(58) Field of Search .......................... 29/830, 825, 846, 29/852

(56) References Cited

U.S. PATENT DOCUMENTS

| | | | | |
|---|---|---|---|---|
| 4,250,616 A | * | 2/1981 | Klimek et al. ................. | 29/830 |
| 4,763,403 A | * | 8/1988 | Klein et al. .................... | 29/830 |
| 4,930,215 A | * | 6/1990 | Roche et al. .................. | 29/830 |
| 5,220,723 A | * | 6/1993 | Okada ........................... | 29/830 |
| 5,261,153 A | * | 11/1993 | Lucas ............................ | 29/830 |
| 6,108,903 A | * | 8/2000 | Nakatani et al. .............. | 29/830 |

FOREIGN PATENT DOCUMENTS

| | | |
|---|---|---|
| CH | 5 67 867 A5 | 9/1973 |
| DE | 13 01 379 B | 1/1966 |
| DE | 38 31 610 A1 | 9/1988 |
| DE | 41 08 986 A1 | 3/1991 |
| DE | 196 11 584 A1 | 3/1996 |
| DE | 196 17 055 C1 | 4/1996 |

* cited by examiner

Primary Examiner—Carl J. Arbes
(74) Attorney, Agent, or Firm—Browdy and Neimark, P.L.L.C.

(57) ABSTRACT

A multilayer printed board compound comprises at least two planely superposed printed boards, each of which having an electrically insulating mother board, electrically conductive circuit paths, which are provided on at least one side of the mother board, and recesses, which are defined laterally by the circuit paths and towards the mother board by the mother board; and at least one preimpregnated board, which is disposed between the printed boards for joining the printed boards; wherein the recesses, which are disposed between the mother boards of the respective printed boards, are filled substantially entirely with a synthetic resin paste; and wherein the at least two printed boards and the at least one preimpregnated board are joined by pressing.

34 Claims, 2 Drawing Sheets

MULTILAYER BOARD COMPOUND AND METHOD FOR THE MANUFACTURE THEREOF

BACKGROUND OF THE INVENTION

1. Field of the Invention

The invention relates to a multilayer printed board compound as well as a method for the manufacture thereof and for the manufacture of planar transformers and planar coils on the basis of the multilayer printed board compounds.

2. Background Art

Multilayer printed board compounds have been known for some time under the designation "multilayer". In this case, several layers of printed circuit board are disposed one above the other and joined to each other by so-called "prepregs". The typical thickness of the base circuit paths—also referred to as conducting paths—used herein, which are structured by photographic engraving techniques, is in the range of approximately 18 $\mu$m to 70 $\mu$m so that the recesses between the circuit paths are filled with resin that emerges from the prepregs upon pressing. Owing to developments in automotive industry, the energy demand for current supply in the vehicle has increased, requiring novel high performance power units. Owing to restricted conductivity, the known printed board systems, which have copper circuit paths of 18$\mu$ to 70 $\mu$m of thickness, are not sufficient in the case of high frequency currents. Therefore, printed boards have been developed, the circuit paths of which have a thickness of 400 $\mu$m. Printed boards of this type cannot be connected with each other planely by the methods existing so far, since the resin that emerges from the prepregs upon pressing is not sufficient for completely filling the recesses between the printed boards and keeping the given total thicknesses of the multilayer printed boards. In particular in the case of thermal strains, this may result in delamination of the multilayer printed boards. Furthermore, arc-over voltage will occur between the circuit paths of a printed board and the circuit paths of neighboring printed boards, there being no uniform insulation by resin.

SUMMARY OF THE INVENTION

It is an object of the invention to embody a multilayer printed board compound as well as a method for the manufacture thereof, in which the individual printed circuit boards are durably and regularly joined to each other.

This object is attained in a multilayer printed board compound, comprising at least two printed boards, which are disposed planely one above the other and each of which comprises an electrically insulating mother board, electrically conductive circuit paths, which are provided on at least one side of the mother board, and recesses, which are defined laterally by the circuit paths and towards the mother board by the mother board; and further comprising at least one preimpregnated board disposed between the printed boards for joining the printed boards; wherein the recesses, which are disposed between the mother boards of the respective printed boards, are substantially completely filled with a synthetic resin paste; and wherein the at least two printed boards and the at least one preimpregnated board are joined by pressing. Furthermore, this object is attained by a method for the manufacture of a multilayer printed board compound, comprising the following steps: at least two printed boards are provided, each of which comprising an electrically insulating mother board, electrically conductive circuit paths, which are provided on at least one side of the mother board, and recesses, which are defined laterally by the circuit paths and towards the mother board by the mother board; the recesses of the printed boards are substantially completely filled; at least one preimpregnated board is applied to a first printed board; a second printed board is applied to the preimpregnated board; and the at least two printed boards and the at least one preimpregnated board are joined by pressing.

Additional features and details will become apparent from the description of five exemplary embodiments, taken in conjunction with the drawing.

DESCRIPTION OF THE PREFERRED EMBODIMENTS

Figure 1:
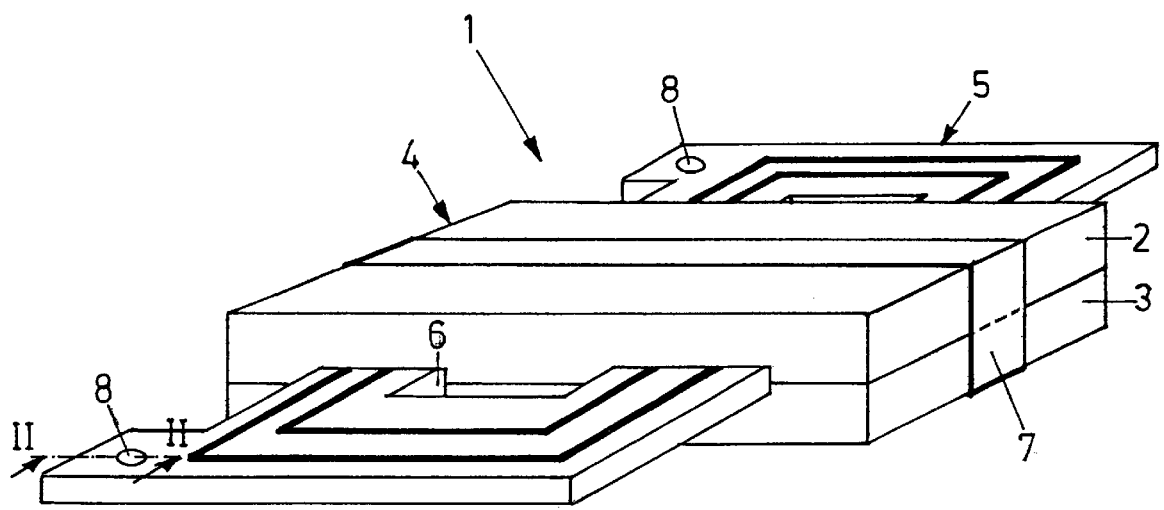
FIG. 1 is a plan view of a transformer with a multilayer printed board compound.

A transformer 1 includes a cuboid ferrite body 4 that comprises a first half 2 and a second half 3. Between the two halves 2, 3, which may be nonsymmetrical, a multilayer printed board compound 5 is disposed in corresponding recesses, which is designated as a multilayer 5 in the following. The multilayer 5 of substantially rectangular cross-sectional shape in a plan view with a centered rectangular opening 6 projects over the ferrite body 4 on two opposite sides. The multilayer 5 may just as well have a round cross-sectional shape with a centered rectangular or round opening 6. The two halves 2, 3 are such that the front faces that are turned toward each other rest on each other without an air gap so that no losses occur in the transformer 1 due to air gaps that would otherwise be produced. It is also possible to form the two halves 2, 3 such that the front faces that are turned toward each other have a defined distance from each other. The two halves 2, 3 are pressed together by a tape 7 that encircles both of them. Bore holes 8 are provided in the multilayer 5 for connection of the transformer 1.

Figure 2:
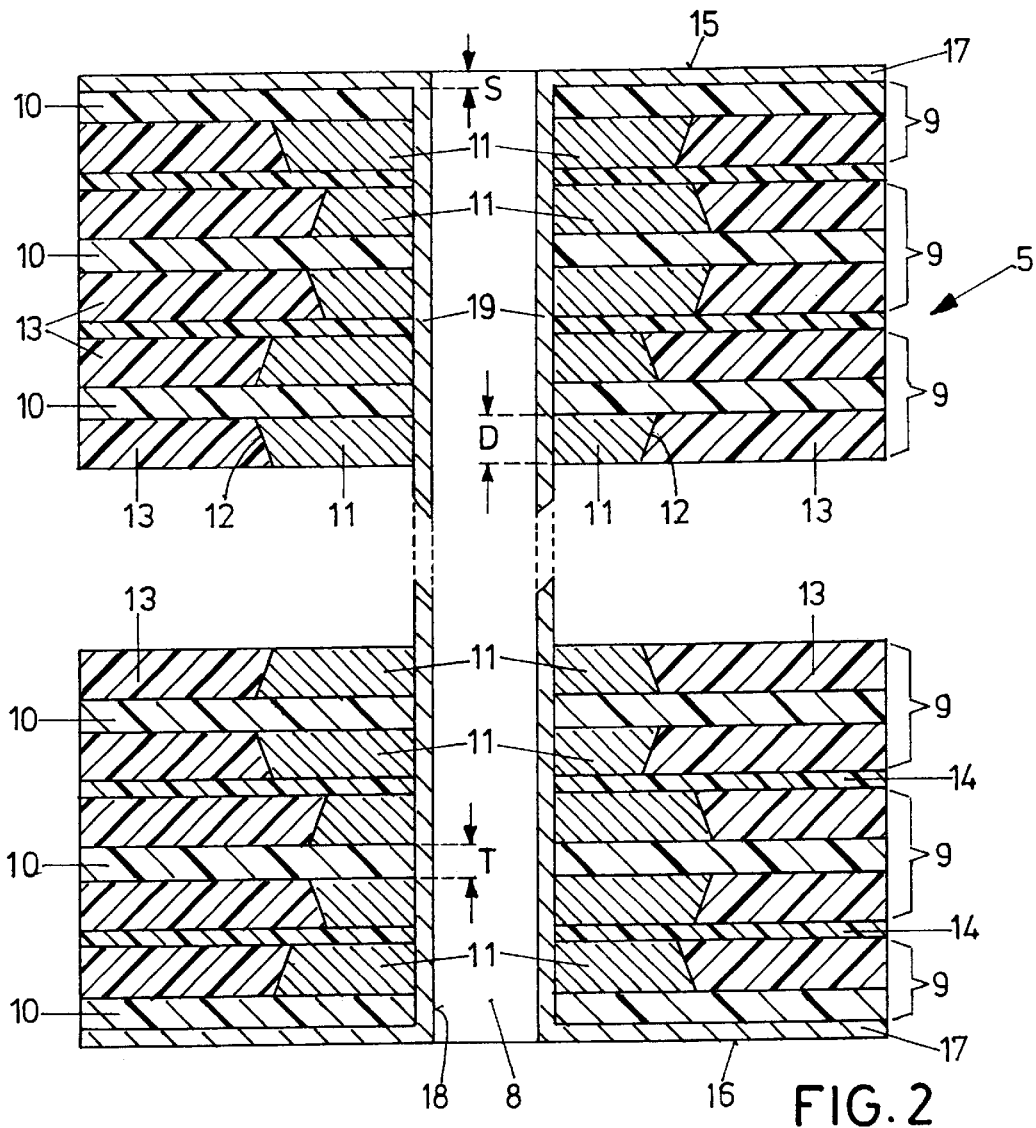
FIG. 2 is a partial cross-sectional view on the line II—II of FIG. 1.
Figure 3:
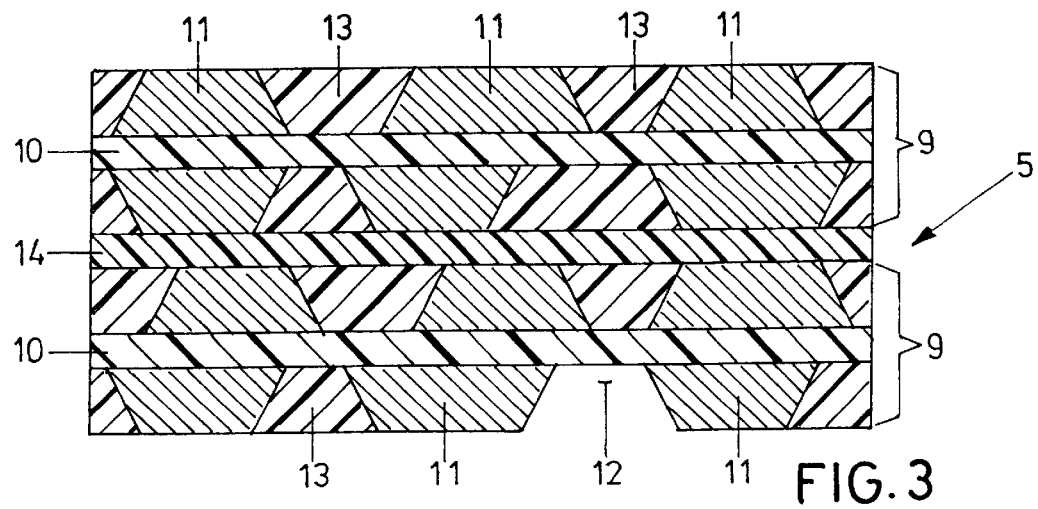
FIG. 3 is a view, on an enlarged scale, of details of a cross section through the multilayer printed board compound according to FIG. 1.

The design of the multilayer 5 is described in the following, taken in conjunction with FIGS. 2 and 3. Inside, the multilayer 5 consists of several printed boards 9, which are disposed one above the other and connected to each other mechanically and electrically. One printed board 9 in each case comprises an electrically insulating mother board 10 which is provided, on one side or on both sides, with metallic circuit paths 11 of a course determined by serigraphic or photographic engraving processes. The mother board 10 has a thickness T of 200 $\mu$m, it being possible to adapt the thickness T to the demands of strength made on the mother board 10 on the one hand and to the requested electrically insulating properties and the requested dielectric strength on the other hand. The circuit paths 11 preferably consist of copper, having a thickness D, to which applies D$\geq$100 $\mu$m, in particular D$\geq$200 $\mu$m, in particular D$\geq$300 $\mu$m and by special advantage D$\cong$400 $\mu$m. The circuit paths of the preferred thickness of D$\cong$400 $\mu$m are circuit paths of a thickness exceeding that of circuit paths commonly used in microelectronics approximately by a factor of 5 to 10. This permits them to be used in the case of high-frequency currents and high powers, in particular in the case of a potential of 42 volts applied to a multilayer 5. Provided between the circuits paths 11 on one side in each case of a mother board 10 are recesses 12 which are open outwards and which are defined laterally by neighboring circuit paths 11 and toward the mother board 10 by the mother board 10. The recesses 12 originate when the circuit paths 11 are produced from an entirely metal-coated mother board 10 by the metal located there-between being removed by engraving.

For connecting the individual printed boards 9 that are disposed one above the other, the recesses 12 are substantially completely filled with a synthetic resin paste 13. This means that the recesses are filled with the synthetic resin paste 13 by more than 90%, in particular by more than 98% and with special preference by more than 99.9%. The synthetic resin paste 13 is preferably an epoxy resin. The synthetic resin paste 13 must not contain any solvents and shrink during curing, it must be thermosetting and have cold-working properties. It is important that the synthetic resin paste 13 fills the recess 12 without leaving any spaces and without bubble formation for sufficient and defined insulation to be ensured between neighboring circuit paths 11 of the same printed board 9 and between superposed circuit paths 11.

Provided between superposed printed boards 9 are one or several preimpregnated boards 14 which lie directly upon each other and which are designated as "prepregs" in technical language. The preimpregnated boards are synthetic resin impregnated glass-fiber fabrics. One or several preimpregnated boards 14 may be used, depending on the insulation required between superposed printed boards 9. On the upper side 15 and the lower side 16 of the multilayer 5, the in each case outermost printed board 9 does not possess any circuit paths 11 externally. This helps attain as smooth as possible a surface. By alternative, it is possible, on the respective outside of the uppermost and lowermost printed board 9, to provide circuit paths that are thinner than the mentioned circuit paths 11 of the thickness D, ranging in particular from 18 $\mu$m to 70 $\mu$m of copper. In this way it is possible to arrange the energized parts within the multilayer 5, whereas electronic components may be provided on the upper side 15 and the lower side 16. On the upper side 15 and the lower side 16, the multilayer 5 has a metal covering layer 17 preferably of copper and of a thickness S of approximately 100 $\mu$m. The covering layer 17 is formed by electrodeposited copper reinforced by tin, nickel, gold or silver as a surface protection.

The multilayer 5 is thermo-compressed. It has excellent mechanical properties. In particular, it is very stable, the interior printed boards thus being protected from mechanical damaging. Thermal strain does not lead to delamination of the individual printed boards 9 i.e., detachment of layers. It is possible to integrate the windings of the transformer on the one hand and the control electronics on the other in a multilayer 5, with the power-carrying coils being disposed in the multilayer 5 and the control electronics thereon. The multilayer 5 can be milled and drilled, which means it can be easily worked.

The multilayer 5 has connection bore holes 8, which are open on both sides. The inner wall 18 of the respective connection bore hole 8 possesses an electrodeposited contact coating 19 of metal, in particular copper. Owing to the type of electro-deposit, this coating 19 is electrically conductively connected to the superposed circuit paths 11 that directly adjoin the respective connection bore hole 8. In this way it is possible to apply signals or higher currents to certain printed boards 9 of the multiplayer 5 or to receive them therefrom.

The following is a description of a method for the manufacture of the multilayer 5 by means of serigraphy in accordance with a first embodiment. First, printed boards 9 are produced by lithographic treatment, on one side or on both sides having copper circuit paths 11 which are separated from each other by recesses 12. A screen-printing process is used for filling the recesses 12, with a synthetic resin paste 13 being employed instead of ink. The screen used in the process has openings precisely where the recesses 12 of the various printed boards 9 are located. In this method, synthetic resin is pressed through the screen into the recesses 12 for them to be completely filled. Then the surface of the printed board 9 is smoothed by a squeegee. Then the coated printed board 9 is precured in a thermal process, preferably by circulating-air drying at a temperature of 100° C. to 150° C. for a period of 15 to 60 minutes. One or several layers of the preimpregnated board 14 are applied to the printed board 9 which has been filled with synthetic resin paste and precured. Another printed board 9 is put thereon, the recesses 12 of which have been filled in accordance with the process described above. This is continued until the desired number of printed boards 9 is reached. Then the overall arrangement of printed boards 9 is compressed by the action of heat so that the synthetic resin paste 13 in the recesses 12 as well as the resin in the preimpregnated board 14 cures without any release of solvents.

In accordance with a second embodiment, a soldering paste printing method or stenciling method is used. In this case, a sheet metal or steel stencil is used instead of a screen; this stencil is solid, more durable and a lot smaller. The synthetic resin paste 13 is forced therethrough into the recesses 12. Otherwise, the method corresponds to that according to the first embodiment.

According to a third embodiment, the synthetic resin paste is applied to the entire surface of a printed board 9 and forced by rolls into the recesses 12. Then the surface is smoothed by a squeegee. As opposed to the two embodiments described first, advantages reside in that the surface thus produced is completely plane, which is not ensured by screen or stencil printing when the screen or stencil may be slightly displaced on the printed board and additional, protruding layers of the synthetic resin paste 13 are produced on the circuit paths 11.

In keeping with a fourth embodiment, for filling the recesses 12, use may be made of a method which is employed in semiconductor production for filling holes and bores with paint. A stationary wave is produced in a synthetic resin bath between several rotating rolls that are parallel to each other in a plane. The printed board is forcibly guided along this wave with the to be filled recesses 12 turned downwards so that the crest of the wave contacts the printed board 9 for the synthetic resin paste 13 to penetrate the recesses 12.

According to a fifth embodiment, a method may be used for filling the recesses 12 which will be described below. The synthetic resin paste is applied to the upper side as well as to the lower side of each printed board 9. It is also possible to apply the synthetic resin paste only to one side. First, the synthetic resin paste, in the form of a strip of a width of 1 cm to 2 cm and of a length that corresponds to the width of the printed board 9, is applied to a plastic film. The plastic film may be of polyester, having a thickness of preferably 25 $\mu$m to 125 $\mu$m. The quantity of synthetic resin paste is sufficient for completely filling the recesses 12 when uniformly spread over the surface of the printed board 9. Then the printed board 9 is placed on the mother board which is provided with a strip of synthetic resin paste so that the strip of synthetic resin contacts the printed board 9 along the front edge and over the entire width of the printed board 9. Then a strip of synthetic resin paste is applied to the other side of the printed board 9 equally on the front edge thereof by a width of 1 cm to 2 cm and over the entire width of the printed board 9, the quantity being sufficient to completely fill the recesses 12 on this side of the printed board. Then the side of the printed board 9 that is provided with synthetic resin is covered with a film for instance of polyester preferably of a thickness of 25 µm to 125 µm. In the vicinity of the front edge of the printed board 9 and on opposite sides, strips of synthetic resin are located on the upper side and lower side, each of which is covered by a film. Then the package of plastic film, synthetic resin paste, printed board 9, synthetic resin paste, plastic film is guided through a so-called hot-roll laminator, which has several heated rolls between which to pass the package. This leads to the synthetic resin paste being spread over the entire upper side and lower side of the printed board 9 with the recesses 12 on the upper and lower side of the printed board 9 being completely filled. Then the synthetic resin paste is precured analogously to the method specified for the first embodiment. After the precuring job, the temperature-resistant and synthetic-resin-resistant plastic foil may be peeled off on both sides. Joining several printed boards one upon the other will then take place for instance by the method described for the first embodiment. It is of special advantage that proper and clean handling is possible even in the case of double-sided coating because of the plastic films. The thickness of the synthetic resin layer can be adjusted uniformly; the surfaces produced are very planar. As compared to the fourth embodiment, there is the advantage that a hundred percent pure synthetic resin is used that cannot have been rendered impure by preceding coatings. Precise pressure and temperature regulation is possible in the hot-roll laminator for optimum resin viscosity to be adjusted. Automated and continuous process flow is possible. Metering the synthetic resin paste can easily be regulated.

What is claimed is:

1. A method for the manufacture of a compound multi-layer printed board (5), comprising
   providing a first printed board (9) and at least one second printed board (9), each of which comprises:
   an electrically insulating mother board (10),
   electrically conductive circuit paths (11), which are provided on at least one side of the mother board (10), and
   recesses (12), which are defined laterally by the circuit paths (11) and extend in a thickness direction towards the mother board (10);
   substantially completely filling the recesses (12) of the first and second printed board (9) with a synthetic resin paste (13) by screen printing;
   applying at least one preimpregnated board (14) to the first printed board (9);
   applying said at least one second printed board (9) to the preimpregnated board (14); and
   pressing together the first printed board (9), the at least one preimpregnated board (14) and the at least one second printed board (9) to provide a joined assembly.

2. A method according to claim 1, comprising:
   pressing the synthetic resin paste (13) through a screen used in said screen printing into the recesses (12), the screen having openings precisely where the recesses (12) of the first printed board and the at least one second printed board (9) are located.

3. A method according to claim 1, further comprising:
   smoothing the surface of the first printed board and at least one second printed board (9) by a squeegee, after the recesses (12) have been filled with the synthetic resin paste (13).

4. A method according to claim 1, further comprising:
   precuring the filled first printed board and at least one second printed board (9) in a thermal process, after the recesses (12) have been filled with the synthetic resin paste (13).

5. A method according to claim 3, further comprising:
   precuring the filled first printed board and the at least one second printed board (9) in a thermal process, after the surfaces of the first printed board and the at least one second printed board (9) have been smoothed.

6. A method according to claim 1, further comprising:
   compressing the joined assembly of first and at least second printed boards (9) while applying heat.

7. A method for the manufacture of a compound multi-layer printed board (5), comprising:
   providing a first printed board (9) and at least one second printed board (9), each of which comprises:
   an electrically insulating mother board (10),—
   electrically conductive circuit paths (11), which are provided on at least one side of the mother board (10), and
   recesses (12), which are defined laterally by the circuit paths (11) and extending thicknesswise towards the mother board (10);
   substantially completely filling the recesses (12) of the first printed board and the at least one second printed board (9) with a synthetic resin paste (13) by screen printing, wherein the synthetic resin paste (13) is pressed into the recesses (12) through a screen having openings precisely where the recesses (12) of the first printed board and the at least one second printed board (9) are located;
   applying at least one preimpregnated board (14) to the first printed board (9);
   applying the at least one second printed board (9) to the preimpregnated board (14); and
   pressing together the first printed board (9), the at least one preimpregnated board (14) and the at least one second printed board (9) to provide a joined assembly.

8. A method according to claim 7, further comprising:
   smoothing the surface of the first printed board and at least one second printed board (9) by a squeegee, after the recesses (12) have been filled with the synthetic resin paste (13).

9. A method according to claim 7, further comprising:
   precuring the filled first printed board and the at least one second printed board (9) in a thermal process, after the recesses (12) have been filled with the synthetic resin paste (13).

10. A method according to claim 8, further comprising:
    precuring the filled first printed board and the at least one second printed board (9) in a thermal process, after the surface of the first printed board and the at least one second printed board (9) have been smoothed.

11. A method according to claim 7, comprising:
    compressing the joined assembly of first and second printed boards (9) while applying heat.

12. A method for the manufacture of a compound multi-layer printed board (5), comprising:
    providing a first printed board (9) and at least one second printed board (9), each of which comprises:

an electrically insulating mother board (10),
electrically conductive circuit paths (11), which are provided on at least one side of the mother board (10), and
recesses (12), which are defined laterally by the circuit paths (11) and which extend thicknesswise towards the mother board (10);
substantially completely filling the recesses (12) of the first printed board and the at least one second printed board (9) with a synthetic resin paste (13) by screen printing;
smoothing the surface of the filled first and the at least one second printed board (9) with a squeegee;
applying at least one preimpregnated board (14) to the first printed board (9);
applying the at least one second printed board (9) to the preimpregnated board (14); and
joining by pressing together the first printed board (9), the at least one preimpregnated board (14) and the at least one second printed board (9) to provide a joined assembly.

13. A method according to claim 12, comprising:
pressing the synthetic resin paste (13) through a screen used in the screen printing into the recesses (12), the screen having openings precisely where the recesses (12) of the first and at least one second printed boards (9) are located.

14. A method according to claim 12, further comprising:
precuring the filled first and at least one second printed boards (9) in a thermal process, after the surface of the first and at least one second printed boards (9) have been smoothed.

15. A method according to claim 12, further comprising:
compressing the joined assembly of first and at least one second printed boards (9) while applying heat.

16. A method for the manufacture of a compound multi-layer printed board (5), comprising:
providing a first printed board (9) and at least one second printed board (9), each of which comprises
an electrically insulating mother board (10),
electrically conductive circuit paths (11), which are provided on at least one side of the mother board (10), and
recesses (12), which are defined laterally by the circuit paths (11) and which extend thicknesswise towards the mother board (10);
substantially completely filling the recesses (12) of the first and at least one second printed boards (9) with a synthetic resin paste (13) by screen printing, wherein the synthetic resin paste (13) is pressed in the recesses (12) through a screen used in the screen printing, the screen having openings precisely where the recesses (12) of the first and at least one second printed boards (9) are located;
smoothing the surfaces of the first and at least one second printed board (9) by a squeegee;
applying at least one preimpregnated board (14) to the first printed board (9);
applying the at least one second printed board (9) to the preimpregnated board (14); and
pressing together the first printed board (9), the at least one preimpregnated board (14) and the at least one second printed board (9) to provide a joined assembly.

17. A method according to claim 16, further comprising:
precuring the filled first printed board and the at least one second printed board (9) in a thermal process, after the surface of the first and at least one second printed boards (9) have been smoothed.

18. A method according to claim 16, further comprising:
compressing the joined assembly of first and at least one second printed board (9) while applying heat.

19. A method for the manufacture of a compound multi-layer printed board (5), comprising:
providing a first printed board (9) and at least one second printed board (9), each of which comprises
an electrically insulating mother board (10),
electrically conductive circuit paths (11), which are provided on at least one side of the mother board (10), and
recesses (12), which are defined laterally by the circuit paths (11) and which extend thicknesswise towards the mother board (10);
substantially completely filling the recesses (12) of the first and second printed boards (9) with a synthetic resin paste (13) by roll coating;
applying at least one preimpregnated board (14) to the first printed board (9);
applying the at least one second printed board (9) to the preimpregnated board (14); and
joining by pressing together the first printed board (9), the at least one preimpregnated board (14) and the at least one second printed board (9) to provide a joined assembly.

20. A method according to claim 19, comprising:
applying the synthetic resin paste (13) to the entire surface of at least one said printed board (9) and
forcing, by rolls, the synthetic resin paste (13) into the recesses (12).

21. A method according to claim 19, further comprising:
smoothing the surface of at least one said printed board (9) by a squeegee, after the recesses (12) have been filled with the synthetic resin paste (13).

22. A method according to claim 19, further comprising:
precuring the filled first board and the at least one second printed board (9) in a thermal process, after the recesses (12) have been filled with the synthetic resin paste (13).

23. A method according to claim 21, further comprising:
precuring the filled first and at least second printed boards (9) in a thermal process, after the surfaces of the first and at least second printed boards (9) have been smoothed.

24. A method according to claim 19, further comprising:
compressing the joined assembly of printed boards (9) while applying heat.

25. A method for the manufacture of a compound multi-layer printed board (5), comprising:
providing a first printed board (9) and at least one second printed board (9), each of which comprises
an electrically insulating mother board (10),
electrically conductive circuit paths (11), which are provided on at least one side of the mother board (10), and
recesses (12), which are defined laterally by the circuit paths (11) and which extend in a thickness direction towards the mother board (10);
substantially completely filling the recesses (12) of the first and the at least one second printed boards (9) with a synthetic resin paste (13)) by
applying a strip of a synthetic resin paste along at least one edge of each printed board (9),
covering the strip of a synthetic resin paste and the corresponding side of each said printed board (9) with a film, and passing each said printed board (9), together with the strip of synthetic resin paste and the film, through a laminating machine for the synthetic resin paste to be spread uniformly on the surface of the printed board (9);

applying at least one preimpregnated board (14) to the first printed board (9);

applying the at least one second printed board (9) to the preimpregnated board (14); and joining by pressing together the first printed board (9), the at least one preimpregnated board (14) and the at least one second printed board (9) to provide a joined assembly.

26. A method according to claim 25, wherein said filling of the recesses is carried out on both sides of at least one said printed board (9).

27. A method according to claim 25, further comprising:
precuring the filled first and at least one second printed boards (9) in a thermal process, after the recesses (12) have been filled with the synthetic resin paste.

28. A method according to claim 27, further comprising:
peeling off the film, after the first and at least one second printed boards (9) have been precured.

29. A method for the manufacture of a compound multilayer printed board (5), comprising:
providing a first printed board (9) and at least one second printed board (9), each of which comprises
an electrically insulating mother board (10),
electrically conductive circuit paths (11), which are provided on at least one side of the mother board (10), and
recesses (12), which are defined laterally by the circuit paths (11) and which extend thicknesswise towards the mother board (10;

substantially completely filling the recesses (12) of the first and second printed board (9) with a synthetic resin paste (13) by stencil printing;

applying at least one preimpregnated board (14) to the first printed board (9);

applying the at least one second printed board (9) to the preimpregnated board (14); and joining by pressing together the first printed board (9), the at least one preimpregnated board (14) and the at least one second printed board (9) to provide a joined assembly.

30. A method according to claim 29, comprising:
pressing the synthetic resin paste (13) through a stencil used in the stencil printing into the recesses (12), the stencil having openings precisely where the recesses (12) of the first and at least one second printed boards (9) are located.

31. A method according to claim 29, further comprising:
smoothing the surface of the first and at least one second printed board (9) by a squeegee, after the recesses (12) have been filled with the synthetic resin paste (13).

32. A method according to claim 29, further comprising:
precuring the filled first and at least one second printed boards (9) in a thermal process, after the recesses (12) have been filled with the synthetic resin paste (13).

33. A method according to claim 31, further comprising:
precuring the filled first and the at least one second printed boards (9) in a thermal process, after the surface of the first and at least second printed board (9) have been smoothed.

34. A method according to claim 29, further comprising:
compressing the joined assembly of first and at least one second printed boards (9) while applying heat.

* * * * *